United States Patent
Sarigiannis et al.

(10) Patent No.: US 7,048,968 B2
(45) Date of Patent: May 23, 2006

(54) METHODS OF DEPOSITING MATERIALS OVER SUBSTRATES, AND METHODS OF FORMING LAYERS OVER SUBSTRATES

(75) Inventors: Demetrius Sarigiannis, Boise, ID (US); Garo J. Derderian, Boise, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 10/652,224

(22) Filed: Aug. 22, 2003

(65) Prior Publication Data

US 2005/0042374 A1    Feb. 24, 2005

(51) Int. Cl.
*C23C 16/40* (2006.01)
*C23C 16/455* (2006.01)

(52) U.S. Cl. ............... 427/255.7; 427/248.1; 427/255.31; 427/255.32; 427/255.34; 427/255.36; 427/901

(58) Field of Classification Search ............ 427/255.7, 427/248.1, 252, 255.32, 901, 255.31, 255.34, 427/255.36
See application file for complete search history.

(56) References Cited

U.S. PATENT DOCUMENTS

| | | | | |
|---|---|---|---|---|
| 4,737,384 A | * | 4/1988 | Murthy et al. | 427/369 |
| 4,970,093 A | * | 11/1990 | Sievers et al. | 427/575 |
| 5,403,621 A | * | 4/1995 | Jackson et al. | 427/255.39 |
| 5,789,027 A | * | 8/1998 | Watkins et al. | 427/250 |
| 6,348,376 B1 | * | 2/2002 | Lim et al. | 438/253 |
| 6,531,224 B1 | * | 3/2003 | Fryxell et al. | 428/405 |
| 6,576,345 B1 | * | 6/2003 | Van Cleemput et al. | 428/447 |
| 6,689,700 B1 | * | 2/2004 | Watkins et al. | 438/762 |
| 6,835,664 B1 | | 12/2004 | Sarigiannis et al. | 438/700 |
| 6,869,876 B1 | * | 3/2005 | Norman et al. | 438/680 |
| 6,951,765 B1 | * | 10/2005 | Gopinath et al. | 438/5 |
| 2002/0090458 A1 | * | 7/2002 | Cotte et al. | 427/331 |
| 2002/0115275 A1 | * | 8/2002 | Choi | 438/584 |
| 2002/0164419 A1 | * | 11/2002 | Fukushima et al. | 427/248.1 |

(Continued)

FOREIGN PATENT DOCUMENTS

EP        1 024 524 A2    8/2000

(Continued)

OTHER PUBLICATIONS

Zemanian et al., "Chemical Functionalization of Nanostructured Materials Using Supercritical Reaction Media", IEEE-Nano 2001, Oct. 29, 2001, p. 288-292.

(Continued)

*Primary Examiner*—Timothy Meeks
*Assistant Examiner*—Wesley D. Markham
(74) *Attorney, Agent, or Firm*—Wells St. John P.S.

(57) ABSTRACT

The invention includes methods of utilizing supercritical fluids to introduce precursors into reaction chambers. In some aspects, a supercritical fluid is utilized to introduce at least one precursor into a chamber during ALD, and in particular aspects the supercritical fluid is utilized to introduce multiple precursors into the reaction chamber during ALD. The invention can be utilized to form any of various materials, including metal-containing materials, such as, for example, metal oxides, metal nitrides, and materials consisting of metal. Metal oxides can be formed by utilizing a supercritical fluid to introduce a metal-containing precursor into a reaction chamber, with the precursor then forming a metal-containing layer over a surface of a substrate. Subsequently, the metal-containing layer can be reacted with oxygen to convert at least some of the metal within the layer to metal oxide.

42 Claims, 4 Drawing Sheets

U.S. PATENT DOCUMENTS

| | | | |
|---|---|---|---|
| 2003/0143841 A1 | 7/2003 | Yang et al. | 438/656 |
| 2003/0183938 A1 | 10/2003 | Wai et al. | 257/762 |
| 2004/0001943 A1* | 1/2004 | Alford et al. | 428/312.6 |
| 2004/0023453 A1* | 2/2004 | Xu et al. | 438/202 |
| 2004/0146636 A1* | 7/2004 | DeYoung et al. | 427/58 |
| 2005/0181613 A1* | 8/2005 | Xu et al. | 438/689 |

FOREIGN PATENT DOCUMENTS

WO    WO 03/106011 A2    12/2003

OTHER PUBLICATIONS

Blackburn et al., "Deposition of Conformat Copper and Nickel Films from Supercritical Carbon Dioxide", Science, vol. 294, Oct. 5, 2001, p. 141-145.

Long et al., "Chemical Fluid Deposition: A Hybrid Technique for Low-Temperature Metallization", Advanced Materials 2000, 12, No. 12, Jun. 16, 2000, p. 913-915.

Mocella, Michael T., "Fluorinated compounds for advanced IC interconnect applications: a survey of chemistries and processes", Journal of Fluorine Chemistry 122, Elsevier, Jul. 1, 2003, 87-92.

Cabanas et al., "Deposition of Cu films from supercritical fluids using Cu(l) βdiketonate precursors", Microelectronic Engineering 64, Elsevier, Oct. 2002, p. 53-61.

Femandes et al., "Reactive Deposition of Metal Thin Films within Porous Supports from Supercritical Fluids", Chem. Mater., vol. 13, No. 6, 2001, p. 2023-2031.

* cited by examiner

METHODS OF DEPOSITING MATERIALS OVER SUBSTRATES, AND METHODS OF FORMING LAYERS OVER SUBSTRATES

TECHNICAL FIELD

The invention pertains to methods of depositing materials over substrates and methods of forming layers over substrates. In particular aspects, the invention pertains to methods of forming layers associated with semiconductor constructions, such as, for example, methods of forming layers suitable for incorporation into semiconductor capacitor devices.

BACKGROUND OF THE INVENTION

There are numerous applications in which it is desired to form layers over substrates. For instance, it is frequently desired to form layers over semiconductor constructions during fabrication of integrated circuitry. Among the methods commonly utilized for layer formation are chemical vapor deposition (CVD) processes and atomic layer deposition (ALD) processes.

ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on particular portions of a substrate even though it occurs at a suitable rate on other portions of the same substrate.

A problem which can occur with CVD processes is that there is frequently less than 100% step coverage. ALD processes can frequently improve step coverage over CVD processes, but several difficulties are encountered during utilization of ALD processes.

One of the difficulties associated with ALD can occur in attempting to deliver sufficient flux of precursor within a reaction chamber for suitable step coverage and uniformity. The difficulty can be particularly severe when utilizing low vapor pressure precursor materials (such as, for example, materials volatilized from solid sources), with low vapor pressure precursor materials typically being understood to be materials having a vapor pressure of less than or equal to about 0.1 Torr at 100° C. Exemplary low vapor pressure precursor materials include $HfCl_4$, $TaF_5$, and pentakis(dimethylamino)tantalum (PDMAT).

Other difficulties encountered in ALD include, for example, difficulties associated with the formation of mixed-material films (sometimes referred to as doped films). For instance, it can be desired to form titanium-doped tantalum pentoxide ($Ta_2O_5$) or aluminum-doped hafnium oxide ($HfO_2$). However, it can be difficult, and often seemingly impossible, to form a homogeneous film comprising low dopant levels during the monolayer-by-monolayer deposition of an ALD process. For instance, it can be desired for titanium-doped $Ta_2O_5$ to have about 8% $TiO_2$ incorporated within a $Ta_2O_5$ matrix. Such can theoretically be accomplished by providing about twenty pulses of a tantalum precursor to one pulse of a titanium precursor during an ALD process. However, the material resulting from such process will typically have an atomic layer of $TiO_2$ sandwiched between thick $Ta_2O_5$ layers, and often the $TiO_2$ atomic layer will not even be continuous. Accordingly, the film resulting from separate pulses of titanium and tantalum in an ALD process is not the desired homogeneous mixture of $TiO_2$ and $Ta_2O_5$. Thus, it is desired to develop new approaches for forming mixed materials utilizing ALD processes.

Although the invention was motivated at least in part by the difficulties discussed above relative to ALD processes, it is to be understood that the invention has applications beyond addressing such difficulties. The invention is therefore not to be limited to the addressing of such difficulties, or even to ALD processes, except to the extent that such limitations are expressly recited in the claims that follow.

SUMMARY OF THE INVENTION

In one aspect, the invention encompasses dispersal of a precursor in a supercritical fluid, introduction of the supercritical fluid/precursor mixture into a reaction chamber, and formation of a monolayer over at least a portion of a substrate surface utilizing the precursor.

In one aspect, the invention encompasses an atomic layer deposition method in which a first precursor is dispersed in a supercritical fluid and flowed into a reaction chamber to form a first component deposited over a surface of a substrate. A second precursor is flowed into the reaction chamber after the first precursor, and separately in time from the flowing of the first precursor into the reaction chamber. The second precursor forms a second component deposited over the surface of the substrate, and the first and second components together form a material deposited over the substrate. The material deposited over the substrate can be any of a number of materials, including, for example, metal-containing materials. The metal-containing materials can consist essentially of or consist of metal, or can be compounds containing non-metals in addition to metals, such as, for example, metal nitrides and metal oxides. In particular aspects, the first precursor can comprise a volatile metal-containing compound, the second precursor can comprise oxygen, and the material formed from the first and second precursors can comprise a metal oxide. Exemplary metal oxides which can be formed in accordance with methodology of the present invention include tantalum oxides, titanium oxides, aluminum oxides and hafnium oxides.

In another aspect, the invention includes a method of forming a layer from at least two different precursors dispersed in a supercritical fluid. The supercritical fluid having the precursors dispersed therein is flowed into a reaction chamber and utilized to form a first material comprising components of the at least two precursors. After the first material is formed, substantially all of any of the at least two precursors remaining free within the chamber is removed, and subsequently a reactant is flowed into the chamber to chemically convert at least some of the first material to a second material. In particular aspects, the first material can comprise hafnium and aluminum, and in other particular aspects the first material can comprise tantalum and titanium. The reactant can comprise oxygen, and accordingly the second material can comprise, for example, aluminum oxide/hafnium oxide or tantalum oxide/titanium oxide.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
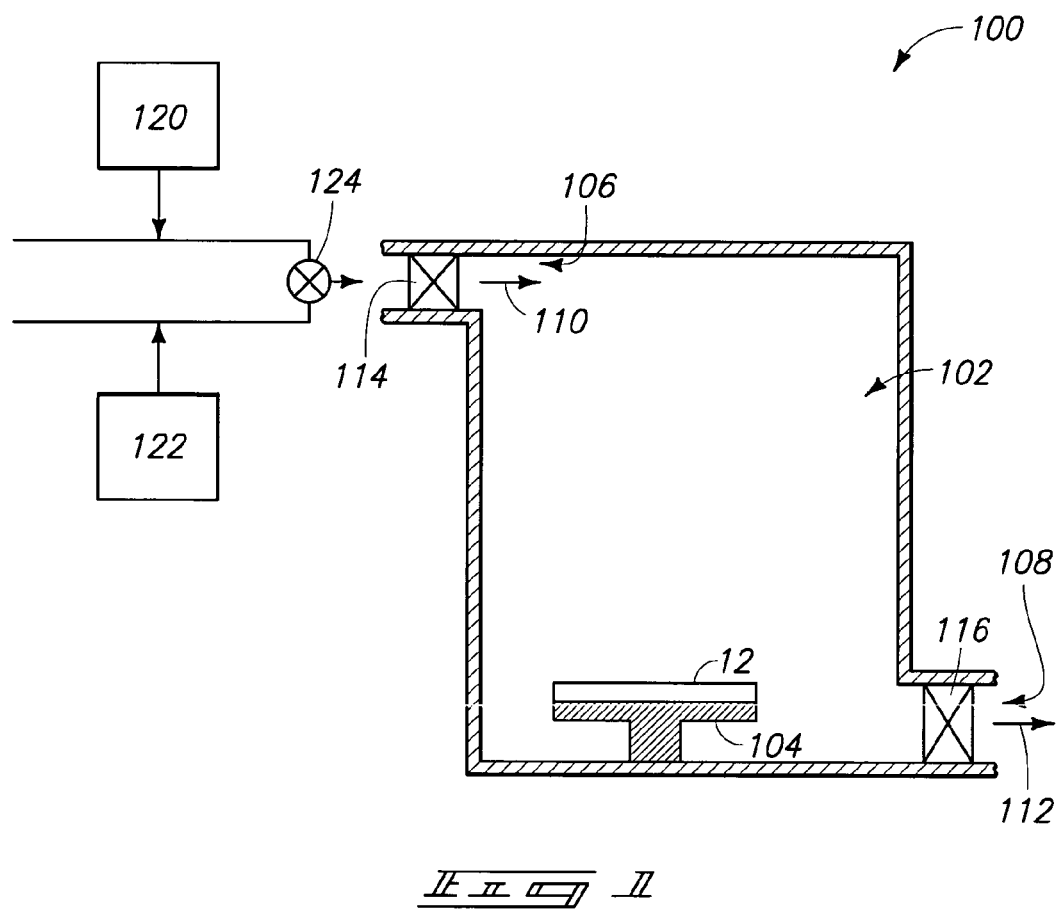
FIG. 1 is a diagrammatic, cross-sectional view of an exemplary apparatus that can be utilized for various treatments encompassed by exemplary aspects of the present invention.

This disclosure of the invention is submitted in furtherance of the constitutional purposes of the U.S. Patent Laws "to promote the progress of science and useful arts" (Article 1, Section 8).

The invention includes various methods in which supercritical fluid is utilized to deliver one or more precursors into a reaction chamber during a deposition process. The supercritical fluid can be any suitable supercritical composition within which the precursor can be dispersed. Although the supercritical fluid can be a neat composition of precursor, typically it will not be. Instead, the supercritical fluid will comprise a composition other than that of the precursor, with an exemplary supercritical fluid being a supercritical fluid comprising, consisting essentially of, or consisting of carbon dioxide.

As is known to persons of ordinary skill in the art, a supercritical fluid is defined as any substance that is above its critical temperature ($T_c$) and critical pressure ($P_c$). $T_c$ is the highest temperature at which a gas can be converted to a liquid by an increase in pressure, and $P_c$ is the highest pressure in which a liquid can be converted to a traditional gas by an increase in the liquid temperature. In the so-called critical region there is only one phase, and it possesses properties of both gas and liquid. Supercritical fluids differ from traditional liquids in several aspects. For example, the "solvating power" of a supercritical fluid can frequently be controlled by changing temperature and/or pressure to allow a wide variety precursor materials to be dissolved.

For purposes of interpreting this disclosure and the claims that follow, the term "supercritical fluid" is utilized to refer specifically to a portion of a composition that is in a supercritical state (i.e., is utilized to refer to the supercritical component of a composition). Typically, the materials dispersed and/or dissolved within a supercritical fluid will not be in a supercritical state, and accordingly will not be part of the supercritical fluid. However, precursors dispersed within a supercritical fluid can, in some instances, be in a supercritical state.

Methodologies of the present invention can be utilized in various deposition processes, and in particular aspects will be utilized in atomic layer deposition processes. One of the challenges in conventional ALD is in delivering enough precursor to saturate the surface of the substrate quickly, preferably with a very square concentration pulse. Traditional ALD utilizes gas phase delivery of precursors, which typically provides the following limitations to the ALD process; (1) the concentration of precursor attainable in the gas phase is limited, and can be severely limited for precursors having a low vapor pressure (i.e., a vapor pressure of less than 0.1 Torr and 100° C.), also, the concentration of precursor can be limited by the efficiency with which gas delivery lines to a reaction chamber are heated, as improperly heated delivery lines can result in condensation of precursor along the gas line walls in route to the chamber; and (2) the sharpness of the precursor concentration pulse.

Particular aspects of the present invention can address both of the above-described limitations of ALD processes by utilizing a supercritical fluid to enhance delivery of low-volatility precursors to a reaction chamber. Specifically, dissolving or otherwise dispersing one or more low-volatility precursors in supercritical fluid can allow relatively high concentrations of the precursors to be attained in a given volume. Accordingly, supercritical fluid having one or more precursors dissolved therein can be introduced into a reaction chamber to obtain a relatively high concentration of precursor within the chamber. The high concentration of precursor can then be utilized in an ALD process to form a monolayer over a substrate within the chamber.

Some aspects of the invention comprise maintaining a supercritical state of the supercritical fluid within the reaction chamber during formation of the monolayer, and other aspects of the invention comprise releasing the supercritical fluid from the supercritical state either during the flow of the supercritical fluid into the reaction chamber, or after a desired amount of precursor has been provided within the reaction chamber. In either event, the solubility of precursor within the fluid will typically drop substantially as the fluid changes to a non-supercritical state, which can release a high concentration of precursor onto a substrate surface within the reaction chamber in a short amount of time.

In a specific aspect of the invention, a desired volume of supercritical fluid having one or more precursors dispersed therein is provided within a reaction chamber under conditions at which the supercritical fluid is in a supercritical state. The supercritical fluid is in a sense a reservoir storing a desired amount of precursor within the reaction chamber. Subsequently, the conditions are changed so that the fluid is released from the supercritical state, which results in precursor being released from the fluid. The released precursor forms a high-concentration pulse of precursor, which can, in preferred embodiments, correspond substantially to a desired square pulse of precursor in the ALD reaction chamber.

If the supercritical fluid utilized in a process of the present invention consists of $CO_2$, the critical pressure will be about 73 atmospheres, and the critical temperature will be about 32° C. ALD reaction chambers can be configured to maintain such pressure and temperature, and in particular aspects swagelock fittings can be utilized in connecting lines to the reaction chamber in order to accommodate pressures suitable to maintain the supercritical state of $CO_2$. The $CO_2$ critical temperature of 32° C. is actually lower than process temperatures frequently utilized in ALD reaction chambers, and can be easier to maintain than conventional ALD temperatures. An advantage of utilizing $CO_2$ as the supercritical solvent in methodology of the present invention can be that $CO_2$ will generally not contaminate films formed utilizing such methodology as would other solvents, such as, for example, hydrocarbon solvents.

Methodology of the present invention can be utilized with numerous precursors, including, for example, precursors comprising one or more metals. The metal-containing precursors can be utilized to form materials consisting of, or consisting essentially of metal; or alternatively can be utilized to form materials comprising metal and non-metal elements, such as, for example, metal nitrides or metal oxides. In particular aspects, methodology of the present invention is utilized with aluminum-containing, hafnium-containing, tantalum-containing or titanium-containing precursors.

Exemplary aspects of the invention are described with reference to FIGS. 1–8.

Referring initially to FIG. 1, such shows an apparatus 100 that can be utilized for an exemplary deposition process in accordance with an aspect of the present invention The apparatus 100 includes a reaction chamber 102. A wafer holder 104 is provided within the reaction chamber, and is shown supporting a wafer 12. An inlet 106 extends into chamber 102 and an outlet 108 extends out of the chamber.

Reactant materials are flowed into chamber 102 through the inlet 106, with the direction of reactant material flow being exemplified by an arrow 110. The chamber is exhausted by removing materials from the chamber through outlet 108, with a direction of flow of removed materials being illustrated by arrow 112. A valve 114 is provided across inlet 106 for controlling flow of materials through the inlet, and a valve 116 is provided across outlet 108 for controlling flow of materials through the outlet. A pump (not shown) can be provided downstream of outlet 108 to assist in exhausting materials from within reaction chamber 102.

Apparatus 100 can be utilized for either CVD processes or ALD processes. In an exemplary aspect, apparatus 100 is configured for utilization in an ALD process. In such aspect, two or more precursor compositions are alternately pulsed into the reaction chamber to deposit one or more layers of material over substrate 12.

A pair of precursor compositions 120 and 122 are shown provided exteriorly of chamber 102 and in fluid communication with inlet 106 through a valve 124. Valve 124 can be configured to selectively let only one of the precursor compositions 120 and 122 into chamber 102 at a time.

In operation, one of the precursor compositions 120 and 122 is flowed into chamber 102 to a desired concentration within the chamber. For purposes of this discussion, precursor composition 120 will be referred to as the precursor composition which is first flowed into the reaction chamber. After composition 120 is flowed within the reaction chamber, precursor from the composition forms a monolayer over an exposed surface of substrate 12. Typically there will be excess precursor within reaction chamber 102 so that some precursor remains free within the reaction chamber after the monolayer has been formed. The precursor which remains free within the chamber is substantially entirely flushed from within the chamber. Subsequently, the second precursor composition 122 is flowed into chamber 102. The second precursor composition 122 is flowed into chamber 102 until a desired concentration of precursor from second composition 122 is achieved within the reaction chamber. The precursor from composition 122 then interacts with the monolayer formed from the precursor of composition 120 to either form another monolayer over the first monolayer, or to chemically convert the composition of the first monolayer to a new composition. After a component from precursor 122 is formed over substrate 12, substantially all of the precursor from composition 122 can be flushed (or in other words purged) from within chamber 102.

The term "substantially all" is utilized above to indicate that enough of the free precursor is removed from within the reaction chamber to alleviate, and preferably prevent, chemical reaction from occurring between precursor of first composition 120 and precursor of second composition 122 in any portion of chamber 102 except across the reactive surface over substrate 12. Thus, precursors from compositions 120 and 122 will be free in reaction chamber 102 at different and substantially non-overlapping times relative to one another in particular exemplary ALD applications of the present invention. Specifically, second precursor composition 122 can be considered to be flowed into chamber 100 separately in time from first precursor composition 120 (and vice versa), in that the first and second precursor compositions are not provided simultaneously within the reaction chamber. Such aspect of the invention pertains to ALD processes. It is to be understood that the invention can also have application to CVD processes, and in such processes the first and second precursor compositions can be provided within reaction chamber 102 at the same time.

The alternating flow of precursor compositions 120 and 122 can be, in particular aspects, considered a single iteration of an ALD process. Specifically, a single iteration of an ALD process for forming a deposit over substrate 12 can comprise flowing first precursor composition 120 into reaction chamber 102, purging first precursor composition 120 from reaction chamber 102, flowing second precursor composition 122 into reaction chamber 102, and purging second precursor composition 122 from reaction chamber 102. Multiple iterations of such process can be performed to form a desired material over substrate 12 to a desired thickness.

One or both of precursor compositions 120 and 122 comprise one or more precursors dispersed in a supercritical fluid. In a particular aspect, first precursor composition 120 comprises one or more metal-containing precursors dispersed in supercritical $CO_2$. At least one precursor within composition 120 can, for example, have a vapor pressure of less than or equal to about 0.1 Torr at 100° C., and the dispersal of such precursor within the supercritical fluid can allow a much higher concentration of the precursor to be obtained in a given volume than could occur without the supercritical fluid. For instance, the concentration of precursor that can be dissolved in supercritical fluid is frequently 1000 times greater than a concentration of precursor obtainable in gas phase without the supercritical fluid. Although the supercritical dispersion of various aspects of the invention can be particularly useful for low-volatility precursors, the supercritical dispersion can also be useful even for high volatility precursors. Specifically, dispersion of precursor in a supercritical fluid can enable formation of a more saturated monolayer than a non-supercritical feed.

In particular aspects, the first precursor composition 120 comprises, consists essentially of, or consists of one or more suitable metal-containing precursors (such as, for example, metal halide, or metal organic materials) dispersed in a supercritical fluid comprising, predominately comprising, consisting essentially of, or consisting of $CO_2$. Exemplary metals which can be utilized in the one or more precursors of composition 120 include hafnium, titanium, aluminum and tantalum.

As discussed previously, a supercritical fluid exists in the supercritical state when critical conditions of pressure and temperature are exceeded. If composition 120 comprises precursors disbursed in supercritical fluid, the supercritical state of the fluid can be maintained as the fluid flows from a source of composition 120 to inlet 106. Such can be accomplished by maintaining suitable pressure and temperature along a passageway through which the composition 120 travels to maintain the composition in the supercritical state.

Chamber 102 can be configured so that the conditions within the chamber are at or above the critical conditions of the supercritical fluid so that the supercritical fluid is maintained in a supercritical state as the fluid enters chamber 102. The fluid can thus function as a reservoir to maintain a desired a desired concentration of precursor within the reaction chamber. In such aspect of the invention, composition 120 is flowed into chamber 102 to the desired precursor concentration while maintaining the supercritical state of the fluid. Once the concentration is achieved, the supercritical state of the fluid can continue to be maintained while precursor interacts with a surface of substrate 12 to form a desired monolayer. In other aspects, one or more conditions within the reaction chamber can be changed and dropped below a critical condition so that the supercritical fluid transforms to a non-supercritical state within the reaction chamber. For instance, a pressure within the reaction chamber can be dropped to below a critical pressure to transform the supercritical fluid to a non-supercritical state.

As the fluid transforms to the non-supercritical state, the solvent properties of the fluid drop significantly (frequently by several orders of magnitude) which can release a sharp pulse (i.e., high flux) of non-solvated precursor within chamber 102. Such sharp pulse of precursor can enhance an ALD process of the present invention relative to prior art ALD processes.

In the processing described above, the supercritical state of a supercritical fluid is maintained as the fluid enters chamber 102. It is to be understood that the invention encompasses other aspects in which the chamber is configured so that a supercritical fluid transforms to a non-supercritical state as the fluid flows into the chamber. In other words, the chamber is operated so that one or more conditions in the chamber are below critical conditions of the supercritical fluid. In such aspects, the supercritical fluid is utilized to retain precursor in solution during transport of the precursor to the reaction chamber, but is not utilized as a reservoir for storing precursor within the reaction chamber.

Second precursor composition 122 can, alternatively or additionally to the first precursor composition, comprise a precursor dispersed in a supercritical fluid. It can be particularly useful for composition 122 to comprise a supercritical fluid in aspects in which a precursor utilized in composition 122 has low volatility.

In an exemplary process, first precursor 120 comprises a metal (such as, for example, one or more of hafnium, aluminum, tantalum or titanium) in a supercritical fluid, and is utilized to form a metal-containing monolayer over a surface of substrate 12. Second precursor composition 122 comprises an oxidant (such as, for example, one or more oxygen-containing materials, which can include, for example $H_2O$ and $O_3$) and is utilized for converting at least some of the metal of the metal-containing monolayer to oxide. In particular aspects, the second precursor composition (which can also be referred to as a reactant composition) is utilized for converting substantially all, or even all, of the metal of the metal-containing monolayer to metal oxide. The oxidant of second precursor composition 122 is typically not dispersed in a supercritical fluid.

If composition 120 comprises a metal-containing precursor and is utilized to form a metal-containing monolayer, the metal formed in the monolayer can be referred to as being a metal-containing component formed from the precursor of composition 120. Also, if the precursor of composition 122 is an oxygen-containing precursor, an oxide formed from reaction of the precursor from composition 122 with the metal-containing layer can be referred to as containing an oxygen component from the precursor of composition 122.

Reaction chamber 100 is described diagrammatically in FIG. 1, and it is to be understood that the reaction chamber can encompass numerous configurations in addition to those shown. For instance, precursors can be introduced into reaction chamber 100 through a showerhead (not shown), and reaction chamber 100 can be configured so that an inert gas is flowed into chamber 102 during the purging of materials from the chamber, and/or during the flow of precursor compositions into the chamber.

Figure 2:
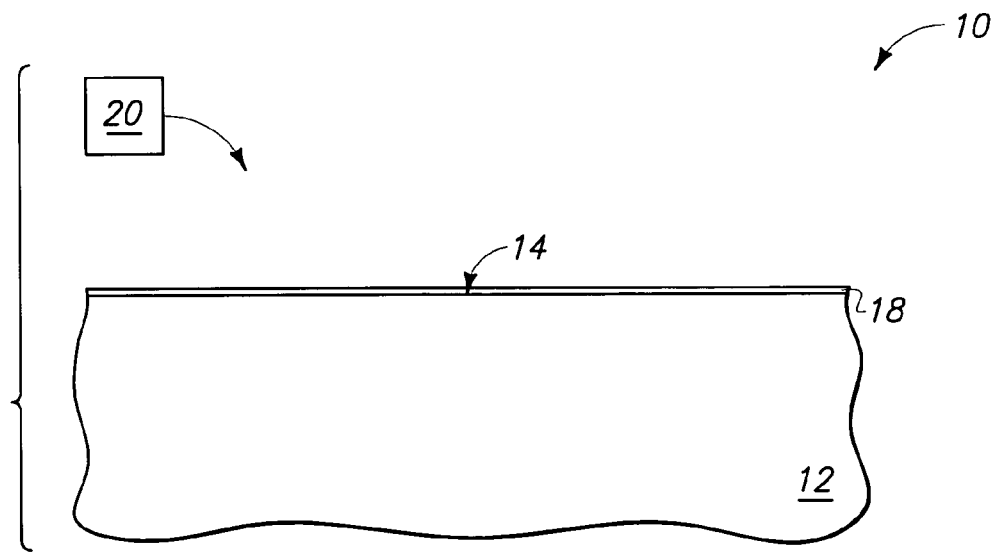
FIG. 2 is a diagrammatic, cross-sectional view of a semiconductor wafer fragment being treated at a preliminary processing stage of an exemplary method of the present invention.

An exemplary embodiment of the invention is described with reference to FIGS. 2–4. Referring initially to FIG. 2, a semiconductor wafer fragment 10 is illustrated at a preliminary processing stage. Wafer fragment 10 comprises a semiconductor substrate 12. Substrate 12 can comprise, consist essentially of, or consist of monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 has an upper surface 14, and is shown being treated with a treatment composition 20. Composition 20 forms a layer 18 over at least a portion of upper surface 14, and in the shown aspect layer 18 is formed across an entirety of upper surface 14.

Treatment composition 20 comprises one or more appropriate precursors, and in particular aspects comprises the composition 120 described with reference to FIG. 1 (e.g., comprises one or more metal-containing precursors dispersed in a supercritical fluid), or comprises one or more precursors released from a composition 120 that contained the one or more precursors in combination with supercritical fluid.

Layer 18 can be considered to comprise at least a component of a precursor from composition 20. In particular aspects, the component is only a portion of the precursor while in other aspects the component is an entirety of the precursor.

Layer 18 can be a monolayer, and typically will be a monolayer if the treatment of substrate 12 with composition 20 occurs in a true ALD process. The interaction of composition 20 with surface 14 to form monolayer 18 can correspond to a physical interaction and/or a chemical interaction, and in particular aspects will correspond to chemisorption.

Composition 20 can comprise any suitable precursor which leads to formation of a desired layer 18. In particular aspects, layer 18 will comprise a metal (i.e., will be a metal-containing layer), and in such aspects the precursor comprises the metal desired in layer 18. Exemplary metals which can be incorporated into the precursor, and ultimately layer 18, include aluminum, hafnium, titanium and tantalum. In specific aspects, the precursor of composition 20 can comprise, consist essentially of, or consist of one or more of titanium fluoride, titanium isopropoxide, PDMAT, $TaF_5$, tantalum methoxide, and $HfCl_4$.

If treatment composition 20 comprises more than one precursor, the treatment composition can be utilized to form a mixed metal layer 18. In particular aspects, the precursors within treatment composition 20 comprise an aluminum-containing precursor and a hafnium-containing precursor, and in some aspects the precursors within treatment composition 20 consist essentially of, or consist of the aluminum-containing precursor and the hafnium-containing precursor. In such aspects, layer 18 can be formed to comprise, consist essentially of, or consist of aluminum and hafnium. In other aspects, the precursors within treatment composition 20 can comprise, consist essentially of, or consist of a titanium-containing precursor and a tantalum-containing precursor. In such aspects, layer 18 can be formed to comprise, consist essentially of, or consist of titanium and tantalum.

It can be desired that layer 18 contain tantalum doped with a small amount of titanium. In such aspects, treatment composition 20 can consist essentially of, or consist of titanium-containing precursor and tantalum-containing precursor, with the ratio of the titanium-containing precursor to the tantalum-containing precursor being from about 5:95 to about 10:90, and with an exemplary ratio being 8:92. Layer 18 can then be formed to comprise from about 5 atomic percent (atomic %) to about 10 atomic % titanium, with the remainder being tantalum.

The precursors of treatment composition 20 are preferably provided to high concentration proximate surface 14 of substrate 12, and in a rapid pulse (i.e., are provided in a sharp concentration pulse, or in other words are provided in a relatively square concentration pulse). Such can be accomplished by initially dispersing the precursors in a supercritical fluid, as described with reference to the apparatus 100 of FIG. 1.

Figure 3:
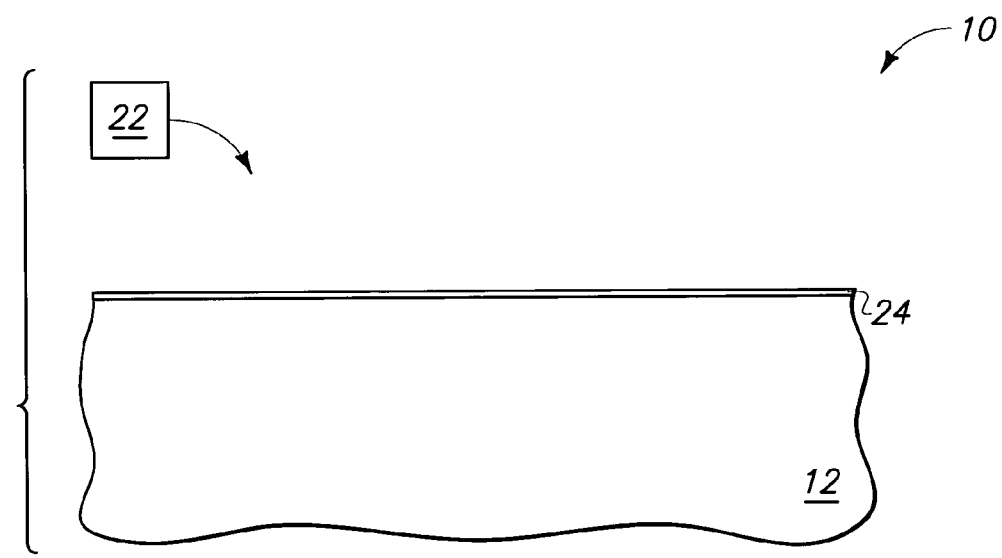
FIG. 3 is a view of the FIG. 2 wafer fragment being treated at a processing stage subsequent to that of FIG. 2.

Referring next to FIG. 3, a second precursor composition 22 is utilized to treat construction 10, and convert layer 18 (FIG. 2) to a layer 24. Second composition 22 can correspond to, for example, the precursor composition 122 described with reference to FIG. 1, or a precursor released from a composition containing precursor in supercritical fluid. In particular aspects, precursor composition 22 will comprise an oxidant. Precursor 22 can, for example, comprise, consist essentially of, or consist of one or both of $O_3$ and $H_2O$. The oxidant can be utilized to treat a metal-containing layer 18 to convert metal of the layer to metal oxide. For instance, if layer 18 comprises, consists essentially of, or consists of one or more of hafnium, aluminum, titanium and tantalum; the layer 24 can comprise, consist essentially of, or consist of one or more of hafnium oxide, aluminum oxide, tantalum oxide and titanium oxide. In other aspects, the precursor composition 22 can comprising a nitridizing reagent, and can be utilized to convert metal of layer 18 to a metal nitride-containing material 24.

Figure 4:
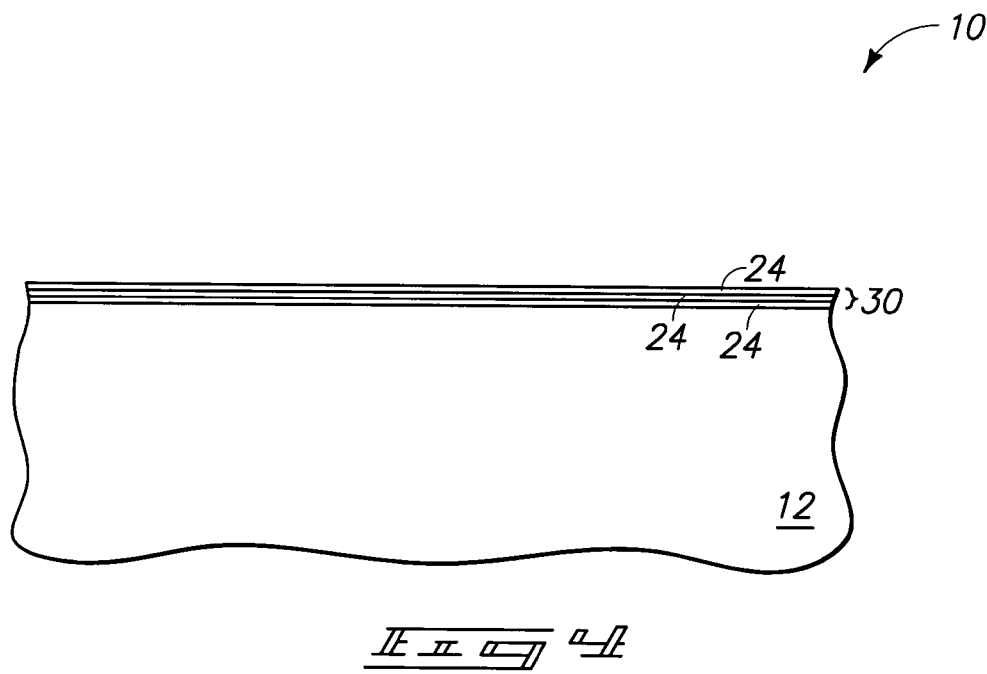
FIG. 4 is a view of the FIG. 2 wafer fragment shown at a processing stage subsequent to that of FIG. 3.

Referring to FIG. 4, construction 10 is illustrated after multiple iterations of the processing utilized to form layer 24 so that a stack 30 containing several layers 24 is formed. The iterations of forming layer 24 can be repeated until stack 30 reaches a desired thickness. Each of the layers 24 can be considered to be a material deposited over substrate 12 utilizing a single iteration of the processing described with reference to FIGS. 2 and 3. Such material can comprise, in particular exemplary aspects, one or more metal oxides containing an oxygen component from precursor 22 and a metal component from precursor 20; and in additional or alternative particular aspects one or more metal nitrides containing a nitrogen component form precursor 22 and a metal component from precursor 20.

Figure 5:
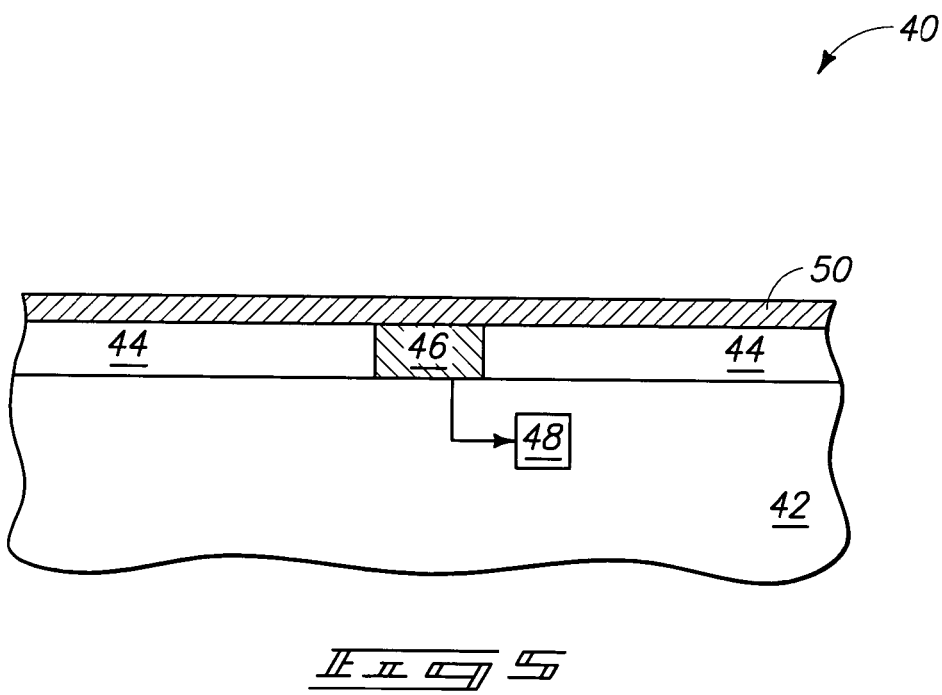
FIG. 5 is a diagrammatic, cross-sectional view of a semiconductor wafer fragment at a preliminary processing stage of a second embodiment method of the present invention.

FIGS. 5–8 illustrate methodology of the present invention incorporated into an exemplary process of capacitor fabrication. Referring initially to FIG. 5, a semiconductor construction 40 comprises a substrate 42 having an electrically insulative material 44 thereover. Substrate 42 can comprise, for example, a monocrystalline silicon lightly-doped with a background p-type dopant. Insulative material 44 can comprise, for example, borophosphosilicate glass (BPSG).

An electrically conductive pedestal 46 extends through insulative material 44. Pedestal 46 can comprise any suitable electrically conductive material, including, for example, metal, metal compounds, and/or conductively-doped silicon. Pedestal 46 is connected to a transistor device 48. Specifically, pedestal 46 is ohmically connected with a source/drain diffusion region of the transistor device 48.

A conductive layer 50 is over pedestal 46 and electrically connected with pedestal 46. Conductive layer 50 can comprise any suitable conductive material or combination of materials, including, for example, metal, metal compounds and/or conductively-doped silicon.

Although substrate 42, insulative material 44 and conductive material 50 are shown as homogeneous materials, it is to be understood that each of them can comprise multiple sub-components (not shown). For example, substrate 42 can comprise numerous levels of conductive and insulative materials, insulative material 44 can comprise multiple layers of insulative materials, and conductive layer 50 can comprise multiple layers of conductive materials.

Figure 6:
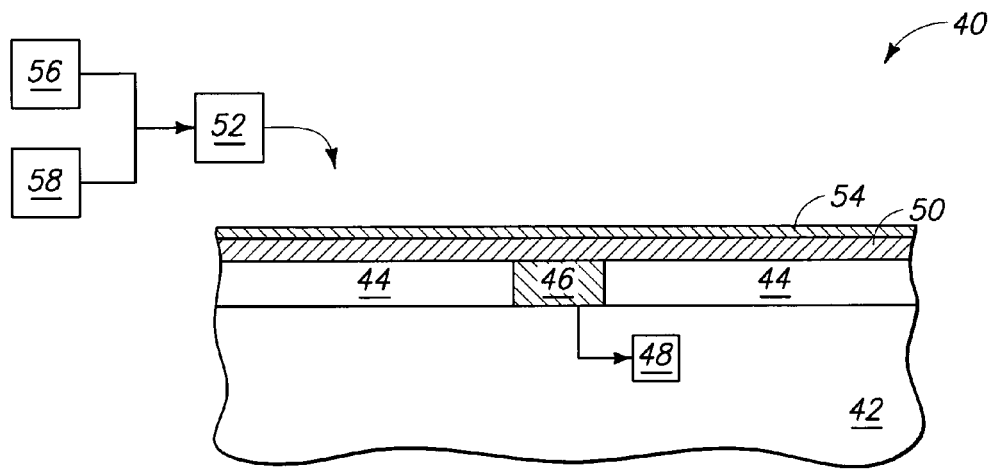
FIG. 6 is a view of the FIG. 5 wafer fragment shown being treated at a processing stage subsequent to that of FIG. 5.

Referring to FIG. 6, construction 40 is treated with a precursor composition 52 to form a layer 54 over the layer 50. Layer 54 is shown to be electrically conductive, and in particular aspects will comprise two or more metals. Layer 54 can be formed, for example, as a monolayer through ALD.

Precursor composition 52 contains a mixture of separate precursors. Two separate precursors 56 and 58 are shown diagrammatically in FIG. 6 as being combined to form the precursor composition 52. The individual precursors 56 and 58 can be metal-containing precursors, with precursor 56 comprising a different metal than does precursor 58.

In a particular aspect, precursor 56 can comprise aluminum and precursor 58 can comprise hafnium. The ratio of aluminum to hafnium can be such that the metal-containing layer 54 is formed to have a small concentration of aluminum (less than 10 atomic %) within a hafnium material, so that the hafnium material is effectively aluminum-doped.

In another aspect, precursor 56 can comprise titanium and precursor 58 can comprise tantalum. The ratio of the titanium-containing precursor to the tantalum-containing precursor can be such that layer 54 is formed to have less than about 10 atomic % titanium. For instance, layer 54 can be formed can be formed to have a ratio of titanium to tantalum of from about 5:95 to about 10:90 (by atomic %), and such ratio can be the same as the ratio of titanium-containing precursor to tantalum-containing precursor in the precursor composition 52. Suitable titanium-containing precursors include, for example, titanium fluoride and titanium isopropoxide; and suitable tantalum-containing precursors include $TaF_5$, tantalum ethoxide and TDMAT.

The precursors of composition 52 are preferably dispersed in a supercritical fluid prior to or during the treatment of FIG. 6, and accordingly composition 52 can be utilized in methodology described with reference to FIG. 1. The supercritical fluid can comprise, consist essentially of, or consist of, for example, $CO_2$. In one exemplary aspect of the invention, precursor composition 52 can consist essentially of supercritical $CO_2$ having an aluminum-containing precursor and a hafnium-containing precursor dispersed therein. In another exemplary aspect, precursor composition 52 can consist essentially of supercritical $CO_2$ having a titanium-containing precursor and a tantalum-containing precursor dispersed therein. One of the advantages of the present invention relative to prior art methodologies can be that multiple precursors can be mixed in a desired ratio in the precursor composition 52, and difficulties commonly associated with premixing precursors in terms of matching vapor pressure and decomposition temperature can be avoided utilizing the supercritical fluid methodologies of the present invention.

If composition 52 comprises a supercritical fluid, the supercritical fluid can, as discussed above with reference to FIG. 1, remain in a supercritical state during formation of layer 54, or can be released to a non-supercritical state within a reaction chamber to provide a pulse of precursor compositions utilized to form layer 54.

Although layer 54 is shown and described as containing at least two metals and as being formed from two or more metal-containing precursors in the embodiment of FIG. 6, it is to be understood that the invention includes other aspects in which layer 54 is formed from only a single metal-containing precursor (or from two or more metal-containing precursors which contain the same metal as one another) so that layer 54 consists essentially of, or consists of a single metal. In particular aspects, layer 54 can be formed to comprise, consist essentially of, or consist of one or more of hafnium, aluminum, titanium and tantalum.

If layer 54 is formed in a reaction chamber (such as the reaction chamber 102 described with reference to FIG. 1), some of the precursor utilized to form layer 54 can remain free within the reaction chamber after formation of the layer. Substantially all of the free precursor can then be removed from the reaction chamber, and subsequently layer 54 can be treated with a reactant to convert at least some of the materials of layer 54 to another material. In such aspect, layer 54 can be referred to as comprising a first material, and at least some of the layer can be considered to be chemically converted to a second material. In particular aspects, essentially all, or entirely all, of layer 54 is converted to the second material.

Figure 7:
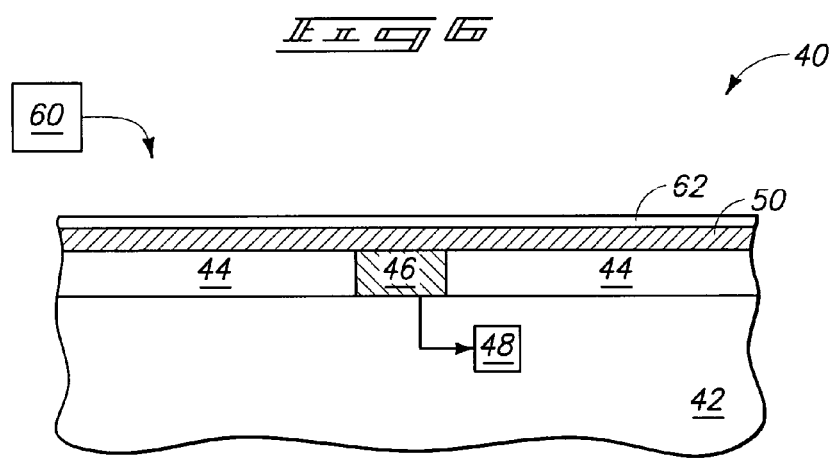
FIG. 7 is a view of the FIG. 5 wafer fragment shown being treated at a processing stage subsequent to that of stage of FIG. 6.

FIG. 7 shows construction 40 as the metals of layer 54 (FIG. 6) are treated with a reactant composition 60 to chemically convert layer 54 to a new material 62 (shown as an electrically insulative material). Reactant 60 can, for example, comprise oxygen, and can be utilized to convert metals of layer 54 to metal oxides. Accordingly, if layer 54 consists essentially of, or consists of titanium and tantalum, layer 62 can consist essentially of, or consist of a mixture of tantalum oxide and titanium oxide. In particular aspects, the ratio of titanium oxide to tantalum oxide within layer 62 will be from about 5:95 to about 10:90, with an exemplary ratio being about 8:92. An advantage of processing the present invention relative to prior art methodologies is that the titanium oxide will be dispersed uniformly without the tantalum oxide, rather than being laminarly interspersed relative to the tantalum oxide.

In another exemplary aspect of the invention, layer 54 can consist essentially of, or consist of aluminum and hafnium, and layer 62 can consist essentially of, or consist of aluminum oxide and hafnium oxide. The aluminum oxide can be present to an atomic % of less than or equal to 10 atomic % and the hafnium oxide can be present to an atomic percent of greater than or equal to 90%. The aluminum oxide can be uniformly distributed throughout the hafnium oxide.

Figure 8:
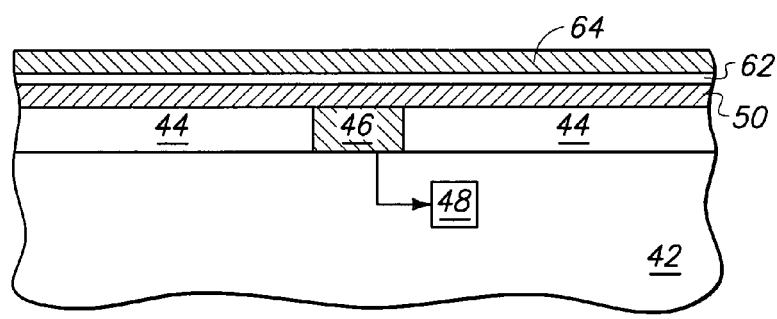
FIG. 8 is a view of the FIG. 5 wafer fragment shown at a processing stage subsequent to that of FIG. 7.

Layer 62 can be utilized as a dielectric material in a capacitor construction. Such is illustrated in FIG. 8. Specifically, a second conductive material 64 is formed over dielectric material 62, and spaced from first conductive material 50 by the dielectric material 62. First conductive material 50 can be considered to be a first capacitor electrode, second conductive material 64 can be considered to be a second capacitor electrode, and dielectric material 62 can be considered to be a capacitor dielectric separating electrodes 50 and 64 from one another. Although second electrode 64 is shown formed directly against dielectric material 62, it is to be understood that the invention includes other aspects (not shown) in which one or more additional dielectric materials are formed over dielectric material 62 prior to formation of second electrode 64.

The capacitor construction comprising materials 50, 62 and 64 can be incorporated into a DRAM device. Specifically, the capacitor construction can be connected to a first source/drain region of transistor device 48, a gate (not shown) of the transistor device can be considered to be a wordline, and a second source/drain region of the transistor device can be connected to a bitline (not shown).

The shown capacitor construction comprising materials 50, 62 and 64 is but one of many capacitor constructions that can be formed utilizing methodology of the present invention. Other capacitor constructions can have other shapes, including, for example, container shapes. Also, it is to be understood that a capacitor device is but one exemplary device that can be formed utilizing methodology of the present invention, and other devices can also be formed utilizing such methodology.

The invention can be utilized for numerous applications. For instance, methodology of the present invention can form porous films, with desired "doping", while alleviating and even avoiding contamination from solvents that would otherwise be utilized in prior art methodologies. Materials formed in accordance with methodology of the present invention can be patterned (via, for example, a selective etch) in further processing (not shown).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing material over a substrate, comprising:
   providing a first precursor and a second precursor different from the first precursor;
   providing an atomic layer deposition reaction chamber having a substrate therein, the substrate having a surface;
   performing at least one iteration of the following sequence:
      flowing the first precursor into the chamber to form a first component monolayer deposited over a surface of the substrate;
      after forming the first component monolayer, purging substantially all of any of the first precursor remaining free in the chamber from the chamber;
      after purging substantially all of the first precursor from the reaction chamber, flowing the second precursor into the chamber to form a second component over the surface of the substrate;
      after forming the second component, purging substantially all of any of the second precursor remaining free in the chamber from the chamber;
   wherein at least one of the first and second precursors is dispersed in a supercritical fluid as it is flowed into the reaction chamber;
   wherein the first precursor comprises a metal;
   wherein the first component monolayer comprises the metal;
   wherein the second precursor comprises oxygen; and
   wherein the second component comprises the oxygen.

2. The method of claim 1 wherein:
   the first precursor comprises hafnium;
   the first component monolayer comprises hafnium from the first precursor; and
   the oxygen of the second precursor reacts with the hafnium of the first component to form hafnium oxide.

3. The method of claim 2 wherein the first precursor is $HfCl_4$ and the second precursor is $H_2O$ or $O_3$.

4. The method of claim 1 wherein:
   the first precursor is part of a mixture of precursors;
   the precursors within the mixture comprise two or more different metals; and
   the first component monolayer comprises the two or more different metals.

5. The method of claim 4 wherein the mixture of precursors consists essentially of an aluminum-containing precursor and a hafnium-containing precursor.

6. The method of claim 4 wherein the mixture of precursors consists essentially of a titanium-containing precursor and a tantalum-containing precursor.

7. The method of claim 6 wherein a ratio of the titanium-containing precursor to the tantalum-containing precursor is from about 5:95 to about 10:90, by atomic percent.

8. The method of claim 6 wherein the titanium-containing precursor is titanium fluoride or titanium isopropoxide, and the tantalum-containing precursor is $TaF_5$, tantalum ethoxide or pentakis(dimethylamino)tantalum.

9. A method of forming a layer over a substrate, comprising:
   providing a supercritical fluid comprising a precursor dispersed therein;
   providing a reaction chamber having a substrate therein, the substrate having a surface;
   flowing the supercritical fluid having precursor dispersed therein into the reaction chamber; the precursor interacting with the surface of the substrate to form a monolayer over at least a portion of the surface of the substrate;
   wherein the precursor is part of a mixture of precursors dispersed within the supercritical fluid, and two or more precursors from the mixture interact with the surface of the substrate to form the monolayer; and wherein the precursors within the mixture of precursors comprise an aluminum-containing precursor and a hafnium-containing precursor.

10. The method of claim 9 wherein the precursors within the mixture of precursors consist essentially of the aluminum-containing precursor and the hafnium-containing precursor.

11. A method of forming a layer over a substrate, comprising:
   providing a supercritical fluid comprising a precursor dispersed therein;
   providing a reaction chamber having a substrate therein, the substrate having a surface;
   flowing the supercritical fluid having precursor dispersed therein into the reaction chamber; the precursor interacting with the surface of the substrate to form a monolayer over at least a portion of the surface of the substrate;
   wherein the precursor is part of a mixture of precursors dispersed within the supercritical fluid, and two or more precursors from the mixture interact with the surface of the substrate to form the monolayer;
   wherein the precursors within the mixture of precursors consist essentially of a titanium-containing precursor and a tantalum-containing precursor; and
   wherein a ratio of the titanium-containing precursor to the tantalum-containing precursor is from about 5:95 to about 10:90.

12. The method of claim 11 wherein the titanium-containing precursor is titanium fluoride or titanium isopropoxide, and the tantalum-containing precursor is pentakis(dimethylamino)tantalum, $TaF_5$ or tantalum ethoxide.

13. A method of depositing material over a substrate, comprising:
   providing a first precursor and a second precursor different from the first precursor;
   providing an atomic layer deposition reaction chamber having a substrate therein, the substrate having a surface;
   performing at least one iteration of the following sequence:
      flowing the first precursor into the chamber to form a first component monolayer deposited over a surface of the substrate;
      after forming the first component monolayer, purging substantially all of any of the first precursor remaining free in the chamber from the chamber;
      after purging substantially all of the first precursor from the reaction chamber, flowing the second precursor into the chamber to form a second component over the surface of the substrate;
      after forming the second component, purging substantially all of any of the second precursor remaining free in the chamber from the chamber;
   wherein at least one of the first and second precursors is dispersed in a supercritical fluid as it is flowed into the reaction chamber; and
   wherein one or more conditions within the reaction chamber are below critical conditions of the supercritical fluid as the supercritical fluid is flowed into the chamber so that the supercritical fluid transforms to a non-supercritical state upon being flowed into the chamber.

14. A method of forming a layer over a substrate, comprising:
   providing a supercritical fluid comprising a precursor dispersed therein;
   providing a reaction chamber having a substrate therein, the substrate having a surface;
   flowing the supercritical fluid having precursor dispersed therein into the reaction chamber; the precursor interacting with the surface of the substrate to form a monolayer over at least a portion of the surface of the substrate; and
   wherein one or more conditions within the reaction chamber are below critical conditions of the supercritical fluid during formation of at least some of the monolayer so that the supercritical fluid is not in a supercritical state within the reaction chamber during formation of at least some of the monolayer.

15. The method of claim 14 wherein the one or more conditions within the reaction chamber which are below the critical conditions of the supercritical fluid include a pressure which is below the critical pressure of the supercritical fluid.

16. The method of claim 14 wherein the one or more conditions within the reaction chamber are below the critical conditions as the supercritical fluid is flowed into the chamber so that the supercritical fluid transforms to the non-supercritical state upon being flowed into the chamber.

17. The method of claim 14 wherein:
   the supercritical fluid is flowed into the chamber in the supercritical state and under conditions suitable to maintain the supercritical fluid in the supercritical state; and
   after the supercritical fluid is flowed into the reaction chamber, conditions within the reaction chamber are changed to reduce the one or more conditions within the reaction chamber to below the critical conditions of the supercritical fluid.

18. A method of depositing material over a substrate, comprising:
   providing a supercritical fluid comprising a first precursor dispersed therein;
   providing a second precursor;
   providing an atomic layer deposition reaction chamber having a substrate therein the substrate having a surface;
   flowing the supercritical fluid having the first precursor dispersed therein into the chamber to form a first component monolayer deposited over a surface of the substrate;
   flowing the second precursor into the chamber after the flowing the first precursor into the reaction chamber and separately in time from the flowing of the first precursor into the reaction chamber, the second precursor within the reaction chamber forming a second component deposited over the surface of the substrate, the first component monolayer and the second component together forming the material deposited over the substrate;
   wherein the first precursor comprises a metal;
   wherein the second precursor comprises oxygen; and
   wherein the material deposited over the substrate comprises an oxide of the metal from the first precursor.

19. The method of claim 18 wherein the first precursor comprises hafnium, titanium or tantalum.

20. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material comprising components of the at least two different precursors, the first material being formed over at least a portion of the surface of the substrate; after forming the first material, some of the at least two precursors remaining free in the chamber;
removing substantially all of the at least two precursors remaining free from within the chamber;
after removing substantially all of the at least two precursors, flowing a reactant into the chamber to chemically convert at least some of the first material to a second material; and
wherein one of the at least two different precursors comprises hafnium and another of the at least two different precursors comprises aluminum; and wherein the first material comprises hafnium from said one of the precursors and aluminum from said other of the precursors.

21. The method of claim 20 wherein the first material consists essentially of the hafnium and the aluminum.

22. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material comprising components of the at least two different precursors, the first material being formed over at least a portion of the surface of the substrate; after forming the first material, some of the at least two precursors remaining free in the chamber;
removing substantially all of the at least two precursors remaining free from within the chamber;
after removing substantially all of the at least two precursors, flowing a reactant into the chamber to chemically convert at least some of the first material to a second material;
wherein one of the at least two different precursors comprises titanium and another of the at least two different precursors comprises tantalum;
wherein the first material comprises titanium from said one of the precursors and tantalum from said other of the precursors; and
wherein the reactant comprises oxygen; and
wherein the chemical conversion of at least some of the first material comprises oxidation of at least some of the tantalum and titanium of the first material.

23. The method of claim 22 wherein the first material consists essentially of the titanium and the tantalum.

24. The method of claim 23 wherein the oxidation forms the second material to consist of tantalum oxide and titanium oxide.

25. The method of claim 22 wherein said one of the precursors is titanium fluoride or titanium isopropoxide; and wherein said other of the precursors is pentakis(dimethylamino)tantalum, $TaF_5$ or tantalum ethoxide.

26. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material comprising components of the at least two different precursors, the first material being formed over at least a portion of the surface of the substrate; after forming the first material, some of the at least two precursors remaining free in the chamber;
removing substantially all of the at least two precursors remaining free from within the chamber;
after removing substantially all of the at least two precursors, flowing a reactant into the chamber to chemically convert at least some of the first material to a second material;
wherein one of the at least two different precursors comprises titanium and another of the at least two different precursors comprises tantalum;
wherein the first material comprises titanium from said one of the precursors and tantalum from said other of the precursors; and
wherein a ratio of said one of the precursors to said other of the precursors within the supercritical fluid is from about 5:95 to about 10:90.

27. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material comprising components of the at least two different precursors, the first material being formed over at least a portion of the surface of the substrate; after forming the first material, some of the at least two precursors remaining free in the chamber;
removing substantially all of the at least two precursors remaining free from within the chamber;
after removing substantially all of the at least two precursors, flowing a reactant into the chamber to chemically convert at least some of the first material to a second material;
wherein one of the at least two different precursors comprises titanium and another of the at least two different precursors comprises tantalum;
wherein the first material comprises titanium from said one of the precursors and tantalum from said other of the precursors; and
wherein a ratio of titanium to tantalum within the first material is from about 5:95 to about 10:90.

28. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material monolayer comprising components of the at least two different precursors, the first material monolayer being formed over at least a portion of the surface of the substrate; after forming the first material monolayer, some of the at least two precursors remaining free in the chamber;
removing substantially all of the at least two precursors remaining free from within the chamber;
after removing substantially all of the at least two precursors, flowing a reactant into the chamber to chemically convert at least some of the first material monolayer to a second material; and wherein the reactant comprises oxygen, and wherein the chemical conversion of at least some of the first material monolayer comprises oxidation of at least some of the first material monolayer.

29. A method of forming a layer over a substrate, comprising:
providing a supercritical fluid comprising at least two different precursors dispersed therein;
providing a reaction chamber having a substrate therein, the substrate having a surface;
flowing the supercritical fluid into the reaction chamber and forming a first material monolayer comprising components of the at least two different precursors, the first material monolayer being formed over at least a portion of the surface of the substrate; after forming the first material, some of the at least two precursors remaining free in the chamber;
removing substantially all of the at least two precursors remaining free from within the chamber;
after removing substantially all of the at least two precursors, flowing a reactant into the chamber to chemically convert at least some of the first material monolayer to a second material; and
wherein one or more conditions within the reaction chamber are below critical conditions of the supercritical fluid at some time while the supercritical fluid is in the chamber so that the supercritical fluid transforms to a non-supercritical state within the reaction chamber.

30. The method of claim 29 wherein the one or more conditions within the reaction chamber which are below the critical conditions of the supercritical fluid include a pressure which is below the critical pressure of the supercritical fluid.

31. The method of claim 29 wherein the one or more conditions within the reaction chamber are below the critical conditions as the supercritical fluid is flowed into the chamber so that the supercritical fluid transforms to the non-supercritical state upon being flowed into the chamber.

32. The method of claim 29 wherein:
the supercritical fluid is flowed into the chamber in the supercritical state and under conditions suitable to maintain the supercritical fluid in the supercritical state; and
after the supercritical fluid is flowed into the reaction chamber, conditions within the reaction chamber are changed to reduce the one or more conditions within the reaction chamber to below the critical conditions of the supercritical fluid.

33. A method of forming a layer over a substrate, comprising:
providing a supercritical fluid comprising a titanium-containing composition and a tantalum-containing composition dispersed therein;
providing a reaction chamber having a substrate therein, the substrate having a surface;
flowing the supercritical fluid into the reaction chamber and forming a material comprising titanium from the titanium-containing composition and tantalum from the tantalum-containing composition, the material being formed over at least a portion of the surface of the substrate; and
exposing the material to oxygen to convert at least some of the tantalum in the material to tantalum oxide, and to convert at least some of the titanium in the material to titanium oxide.

34. The method of claim 33 wherein substantially all of the tantalum in the material is converted to tantalum oxide, and wherein substantially all of the titanium in the material is converted to titanium oxide.

35. A method of forming a layer over a substrate, comprising:
providing a supercritical fluid comprising a titanium-containing composition and a tantalum-containing composition dispersed therein;
providing a reaction chamber having a substrate therein, the substrate having a surface;
flowing the supercritical fluid into the reaction chamber and forming a material comprising titanium from the titanium-containing composition and tantalum from the tantalum-containing composition, the material being formed over at least a portion of the surface of the substrate; and
flowing an oxygen-containing composition into the reaction chamber after forming the material, the oxygen-containing composition interacting with tantalum and titanium of the material to form tantalum oxide and titanium oxide.

36. The method of claim 34 wherein some free titanium-containing composition and free tantalum-containing composition remains within the chamber after forming the material, the method further comprising purging substantially all of the free titanium-containing composition and free tantalum-containing composition from within the chamber prior to the flowing of the oxygen-containing composition into the chamber.

37. A method of forming a layer over a substrate, comprising:
providing a supercritical fluid comprising a titanium-containing composition and a tantalum-containing composition dispersed therein;
providing a reaction chamber having a substrate therein, the substrate having a surface;
flowing the supercritical fluid into the reaction chamber and forming a material comprising titanium from the titanium-containing composition and tantalum from the tantalum-containing composition, the material being formed over at least a portion of the surface of the substrate; and
wherein a ratio of the titanium-containing composition to the tantalum-containing composition within the supercritical fluid is from about 5:95 to about 10:90.

38. A method of forming a layer over a substrate, comprising:
providing a supercritical fluid comprising a titanium-containing composition and a tantalum-containing composition dispersed therein;
providing a reaction chamber having a substrate therein, the substrate having a surface;
flowing the supercritical fluid into the reaction chamber and forming a material comprising titanium from the titanium-containing composition and tantalum from the tantalum-containing composition, the material being formed over at least a portion of the surface of the substrate; and
wherein a ratio of the titanium to the tantalum within the material is from about 5:95 to about 10:90.

39. A method of forming a layer over a substrate, comprising:
providing a supercritical fluid comprising a titanium-containing composition and a tantalum-containing composition dispersed therein;

providing a reaction chamber having a substrate therein, the substrate having a surface;

flowing the supercritical fluid into the reaction chamber and forming a material comprising titanium from the titanium-containing composition and tantalum from the tantalum-containing composition, the material being formed over at least a portion of the surface of the substrate; and wherein one or more conditions within the reaction chamber are below critical conditions of the supercritical fluid at some time while the supercritical fluid is within the reaction chamber so that the super critical fluid transforms to a non-supercritical state within the reaction chamber.

40. The method of claim 39 wherein the one or more conditions within the reaction chamber which are below the critical conditions of the supercritical fluid include a pressure which is below the critical pressure of the supercritical fluid.

41. The method of claim 39 wherein the one or more conditions within the reaction chamber are below the critical conditions as the supercritical fluid is flowed into the chamber so that the supercritical fluid transforms to the non-supercritical state upon being flowed into the chamber.

42. The method of claim 39 wherein:

the supercritical fluid is flowed into the chamber in the supercritical state and under conditions suitable to maintain the supercritical fluid in the supercritical state; and after the supercritical fluid is flowed into the reaction chamber, conditions within the reaction chamber are changed to reduce the one or more conditions within the reaction chamber to below the critical conditions of the supercritical fluid.

* * * * *

UNITED STATES PATENT AND TRADEMARK OFFICE
CERTIFICATE OF CORRECTION

| | | |
|---|---|---|
| PATENT NO. | : 7,048,968 B2 | |
| APPLICATION NO. | : 10/652224 | |
| DATED | : May 23, 2006 | |
| INVENTOR(S) | : Demetrius Sarigiannis | |

It is certified that error appears in the above-identified patent and that said Letters Patent is hereby corrected as shown below:

Page 2 of Title Page, Col. 1, Other Publications –
    Replace "Blackburn et al., "Deposition of Conformat Copper and"
    Insert --Blackburn et al., "Deposition of Conformal Copper and--

Page 2 of Title Page, Col. 2, Other Publications –
    Replace "Femandes et al., "Reactive Deposition of Metal Thin Films"
    Insert --Fernandes et al., "Reactive Deposition of Metal Thin Films--

Col. 20, line 23 –
    Replace "36. The method of claim 34 wherein some free titanium-"
    Insert --36. The method of claim 35 wherein some free titanium- --

Signed and Sealed this

Seventeenth Day of April, 2007

JON W. DUDAS
*Director of the United States Patent and Trademark Office*